United States Patent [19]

Fryer

[11] Patent Number: 5,140,549

[45] Date of Patent: Aug. 18, 1992

[54] INDUCTIVELY SENSED MAGNETIC MEMORY

[75] Inventor: Richard B. Fryer, Minnetonka, Minn.

[73] Assignee: Honeywell Inc., Minneapolis, Minn.

[21] Appl. No.: 716,484

[22] Filed: Jun. 17, 1991

Related U.S. Application Data

[62] Division of Ser. No. 507,682, Apr. 9, 1990, Pat. No. 5,064,499.

[51] Int. Cl.⁵ .............................................. G11C 11/14
[52] U.S. Cl. ...................................... 365/171; 365/172
[58] Field of Search .................................. 365/171, 172

[56] References Cited

U.S. PATENT DOCUMENTS 3,708,789  1/1973  Spain .................................. 365/171

Primary Examiner—Joseph A. Popek
Attorney, Agent, or Firm—Gregory A. Bruns

[57] ABSTRACT

A magnetic thin-film memory in a monolithic integrated circuit using inductive sensing of the memory states occurring therein.

7 Claims, 3 Drawing Sheets

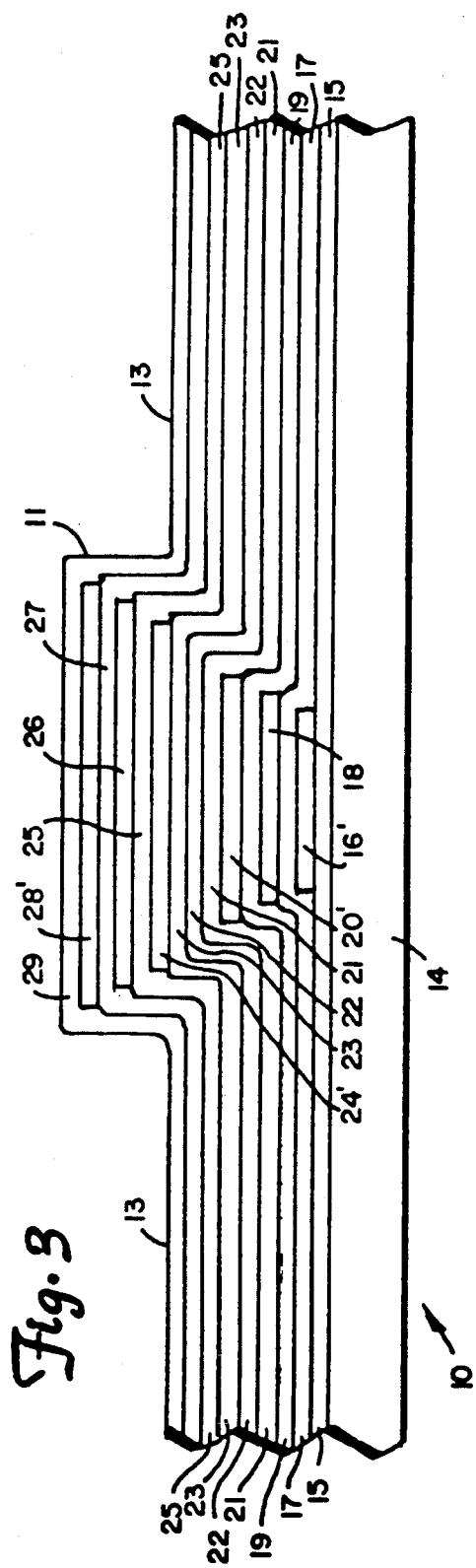
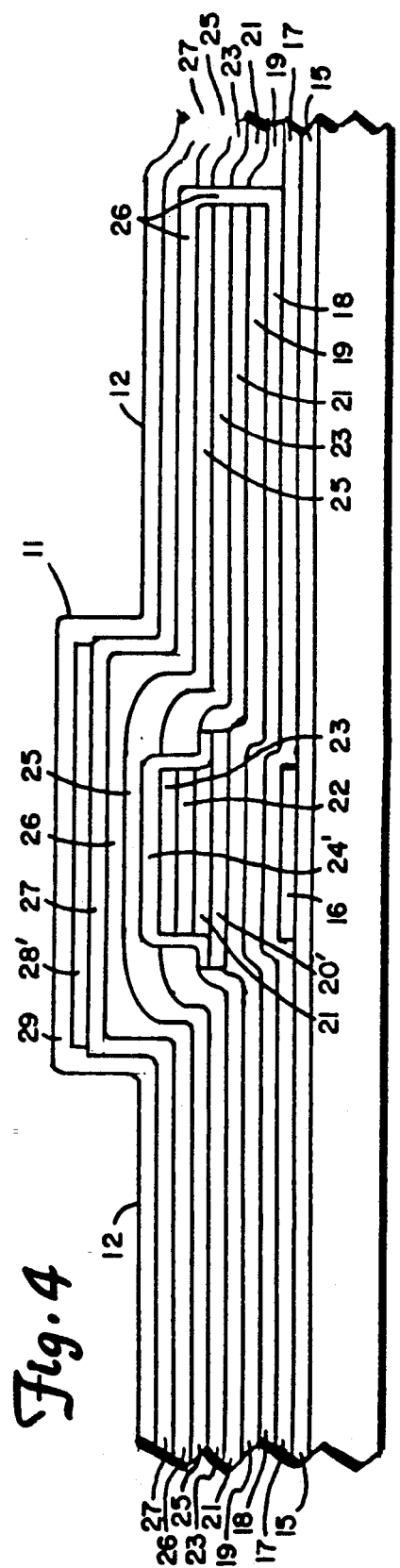

INDUCTIVELY SENSED MAGNETIC MEMORY

This application is a division of application Ser. No. 07/507,682, filed Apr. 9, 1990, now U.S. Pat. No. 5,064,499.

BACKGROUND OF THE INVENTION

The present invention relates to ferromagnetic thin-film memories and, more particularly, to ferromagnetic thin-film memories in which states of the memory cells based on the magnetization direction therein are determined through inductive sensing Digital memories of various kinds are used extensively in computers and computer system components, digital processing systems, and the like Such memories can be formed, to considerable advantage, based on the storage of digital bits as alternative states of magnetization in magnetic materials in each memory cell, typically thin-film materials. These films may be thin ferromagnetic films having information stored therein based on the direction of the magnetization occurring in those films, this information being obtained either by inductive sensing to determine the magnetization state, or by magnetoresistive sensing of such states Such ferromagnetic thin-film memories may be conveniently provided on the surface of a monolithic integrated circuit to thereby provide easy electrical interconnection between the memory cells and the memory operating circuitry in the monolithic integrated circuit.

Ferromagnetic thin-film memory cells, if they are to be provided in a monolithic integrated circuit as indicated above, must be made very small and packed very closely together to achieve a significant density of stored digital bits These requirements lead to problems with inductively sensed memories because the signal levels to be inductively sensed decline with reduced thicknesses and widths for the magnetic thin-film portions used in each memory cell to store a bit as there is then less flux linkage to be inductively sensed. Thus, there is a desire to have an inductively sensed magnetic memory which provides adequate sensing signal magnitudes to be sensed by circuits in a monolithic integrated circuit, and which can be fabricated as part of such a monolithic integrated circuit.

SUMMARY OF THE INVENTION

The present invention provides a magnetic thin-film memory in a monolithic integrated circuit having a lower word conductor, supported on a substrate, and which is electrically connected to an upper word conductor between which are formed .pairs of magnetic thin-film memory layers with a digit line extending between each member of a pair. Magnetic keeper layers may be formed outside the upper and lower word conductors across from the locations where the memory layer portions are formed. The memory layers may be in direct contact with one another around the digit line.

This structure can be fabricated using normal semiconductor device fabrication techniques beginning with providing keeper layer portions on the monolithic integrated circuit substrate, followed by providing in order a separation layer, lower word conductors, another separation layer, and then by providing first memory layer portions. Thereafter, digit lines are provided over the first memory layer portions with each first memory layer portion extent on either side of its digit line being sufficient to permit the corresponding second memory layer portion, provided next, to directly contact it along its digit line. A separation layer is then provided with the upper word conductors then being provided thereon and therethrough to contact a corresponding lower word conductor. A separation layer is then provided with a further set of magnetic keeper layer portions provided thereon. Separation layers can also be provided on either side of the digit lines.

BRIEF DESCRIPTION OF THE DRAWINGS

FIG. 3 shows cross section view 4—4 of a portion of the structure shown in FIG. 2, and FIG. 4 shows cross section view 5—5 of the structure shown in FIG. 2.

DETAILED DESCRIPTION OF THE PREFERRED EMBODIMENTS

Figure 1:
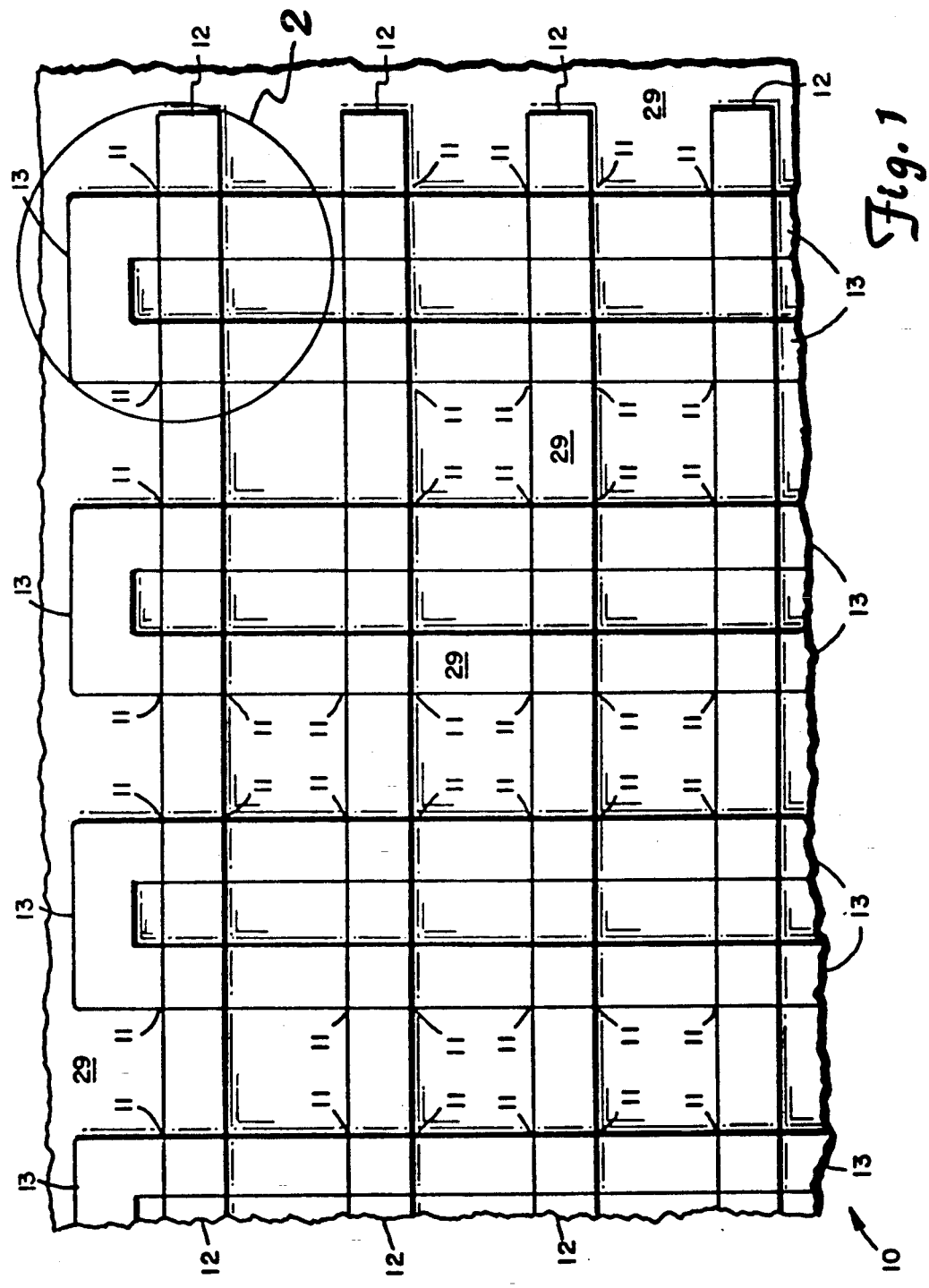
FIG. 1 shows a plan view of a portion of a monolithic integrated circuit embodying the present invention.

FIG. 1 shows a portion of that side of a monolithic integrated circuit, 10, in and on which the circuitry included therein has been fabricated. As can be seen, there are a number of intersection structures, 11, at the intersections of a plurality of horizontal structures, 12, and a plurality of "looped" vertical pair structures, 13, i.e. each pair of vertical structures has the ends thereof shown connected by the same sort of structure forming them. The opposite ends of these pairs are not so connected together, but instead these remaining ends in each pair, not shown, are connected to opposite sides of a corresponding differential amplifier, not shown, for information retrieval purposes.

Each intersection structure 11 pair, formed by including the left-hand and right-hand ones of such structures occurring along a horizontal structure 12 in a single loop structure 13, forms a storage cell for the storage of one bit of information. Individually, each intersection structure 11 represents a magnetic structure in part of which half of the representation of the stored bit occurs, and from which the retrieval of the information contained therein occurs through an inductive retrieval process.

Figure 2:
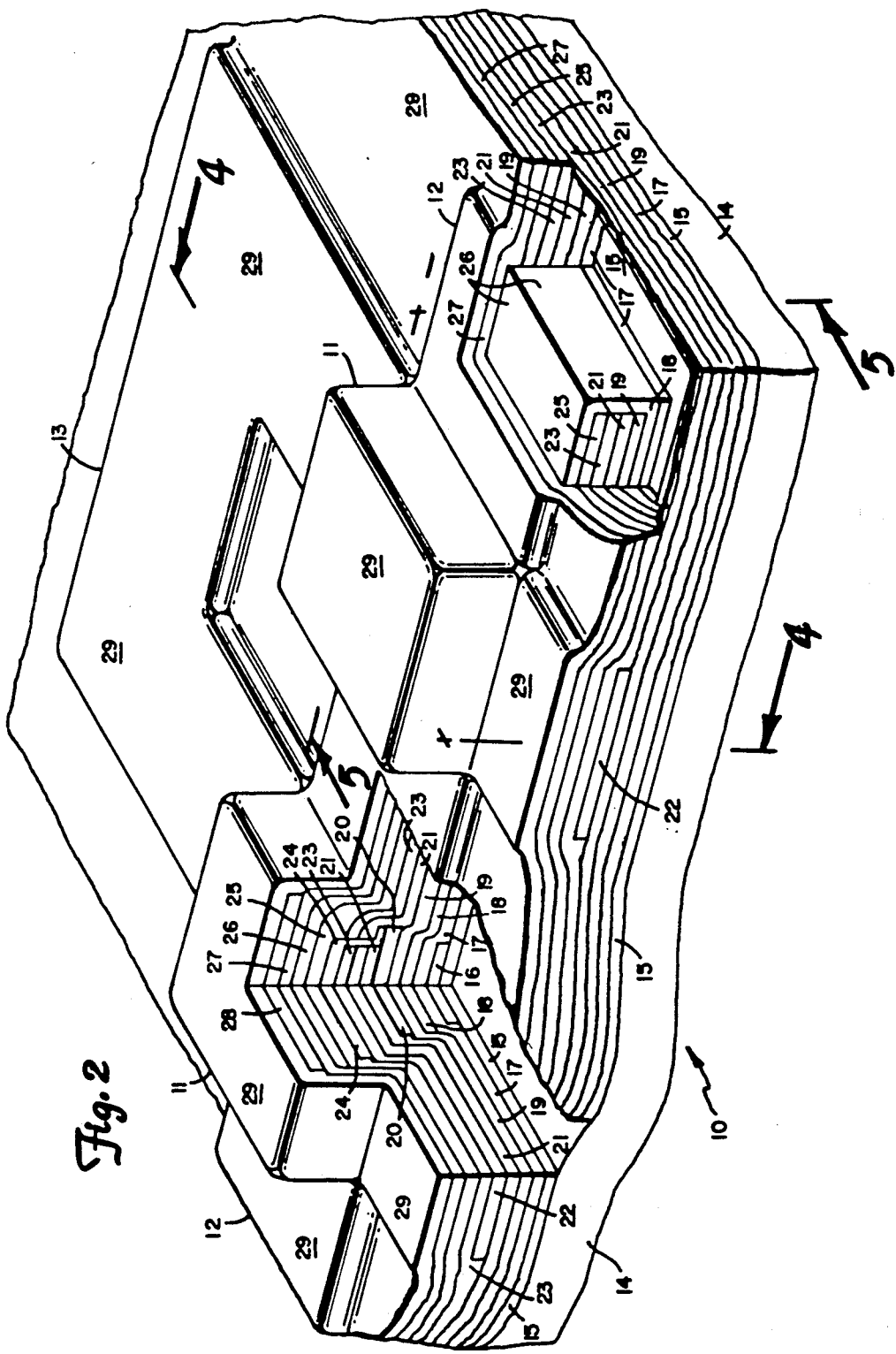
FIG. 2 shows an expanded view of a portion of the structure shown in FIG. 1 in a cross section pictorial view.

A portion in the upper right-hand corner of Figure within a circle designated 2, is shown expanded in FIG. 2 in a partial cross section pictorial view. This structure is fabricated on a doped silicon substrate, 14, which may be of either n-type or p-type conductivity, and essentially of any conductivity suitable for forming the other portions of the monolithic integrated circuit used to operate the magnetic structures shown in FIGS. 1 and 2, portions containing transistors and other circuitry for such purposes. An approximately 1.0 μm silicon nitride, or $Si_3N_4$, base layer, 15, is deposited on substrate 14 using a well-known radio frequency (RF) sputtering method.

Base layer 15 forms both an electrical insulator layer and an oxygen diffusion barrier to prevent oxygen coming out of substrate 14 from oxidizing the magnegic material of certain layers to be later provided. Such oxidation would convert the magnetic materials to other kinds of materials not exhibiting the desired magnetic properties, and so reduce the magnetization based signals available from the storage cell. Substrate 14 and base layer 15 are also shown in FIGS. 3 and 4 which are cross section views of the structure portions shown in FIG. 2.

Next, a thin-film, ferromagnetic layer of approximately 1.0 μm thickness is RF sputtered onto layer 15 to serve as a magnetic keeper, i.e. a magnetically permeable structure to aid in providing a more nearly closed flux path to thereby keep magnetic fluxes generated in operation confined in a desired region. This layer is typically permalloy formed in a composition of about 80% nickel and 20% iron to thereby reduce magnetostriction characteristics of the layer material to approximately zero. Thereafter, portions of this layer are removed by a well-known photoresist application and plasma etching step to form a plurality of lower keepers, one under each intersection 11. This layer portion shown in FIGS. 2, 3, and 4 forming the lower keeper shown there is designated by the numeral Then, an oxygen diffusion barrier layer, 17, of typically 700 Å of silicon nitride is RF sputtered over layer 16 and layer 15 where exposed. No etching of this layer need be performed in this process version. This is followed by providing on layer 17 an aluminum layer of about 0.5 μm alloyed with 4% copper through RF sputtering to form a lower word line. This Al-Cu layer is then etched in a well-known photoresist application and plasma etch step to provide lower word lines, 18, which are located everywhere there will be horizontal structures 12 as shown in FIGS. 2, 3 and 4.

Alternatively, the layer for keepers 16, the layer for diffusion barrier 17, and the layer for lower word line 18 can be RF sputtered one after the other in the deposition device without any etching steps therebetween. Then, a photoresist application and etching step can be provided for all three layers using a single photoresist mask for the etch, including etching here diffusion barrier 17 not etched in the previous alternative, to thereby leave a corresponding keeper layer 16 and corresponding diffusion barrier 17 under the entirety of each of lower word lines 18, i.e. to result in forming lower word line congruent structures. This alternative sequence of steps avoids a photoresist application and etch step to simplify the process.

In either of the foregoing methods of forming lower word lines 18, there is next provided an electrical insulation layer, 19, of silicon nitride around 1.0 μm thick, again by RF sputtering. This layer is provided over the entirety of the structure already fabricated by either of the previous methods described for providing such lower word line structures, and there is no etching of this layer is performed.

The lower memory layer is next provided by RF sputtering and is again a permalloy layer of the same nature as that forming keeper 16, but here is typically 1.5 μm thick. This lower memory layer is deposited in the presence of a magnetic field directed along horizontal structure 12 to induce magnetic anisotropy therein with the easy access oriented substantially parallel to that structure. This lower memory layer is then etched using a well-known photoresist application and plasma etching step to thereby form lower memory layer portions, 20, one being provided in each of intersection structures 11. The lower memory layer portion shown in FIGS. 3 and 4 is designated 20' to distinguish it from portion 20 shown to the left in FIG. 2. A diffusion barrier layer, 21, is then RF sputtered over this entire structure to a thickness of 700 Å. No etching of this last layer is required at this point in the fabrication process.

At this point, a digit line aluminum layer alloyed with 4% copper is RF sputtered onto the structure previously fabricated to a thickness of 0.5 μm. A well-known photoresist application and plasma etch step is then performed to etch this layer to result in digit lines, 22, extending everywhere there will be "loop" structures 13 with digital lines 22 being narrower at intersection structures 11 than are lower memory layer portions 20 therebelow. Again, a silicon nitride diffusion barrier layer, 23, is next RF sputtered over the structure fabricated to this point, layer 23 again being 700Å thick. Openings are then etched in layer 23 to down to those portions of lower memory layers 20 on either side of digit lines 22 at each of intersection structures 11 using a well-known photoresist plasma etch step.

Again, alternatively, to save an etching step, the layer from which lower memory portions 20 are formed, the layer for diffusion barrier 21, the layer from which digit lines 22 are formed and the layer for diffusion barrier 23 can all be provided sequentially in a deposition machine without any etching of any of these layers occurring therebetween. Then, using well-known photoresist application and plasma etch methods, diffusion barrier layer 23 is etched followed by etching the digit line layer to form digit lines 22, and followed further by etching through diffusion barrier 21 using the same photoresist mask for each etching step to provide a structure in which all the commonly etched layers follow digit lines 22 to thereby form digit line congruent structures Then, a further photoresist and etch step is provided for etching the layer from which lower memory portions 20 are formed, which portions are left to be considerably wider at each intersection structure 11 than are the structures congruent with digit lines 22.

At this point, following either of the latter two process sequences for forming digit lines 22 with a diffusion barrier thereover, a further thin-film ferromagnetic layer of permalloy is RF sputter deposited to a typical thickness of 1.5 μm on such structures, again done in a magnetic field oriented along horizontal structures 12 to thereby provide a magnetic anistropy in this layer paralleling those structures. In the former of these last two process sequence alternatives, this ferromagnetic layer will extend through the openings in layers 23 and 21 to come into direct physical contact with each of the lower magnetic memory layer portions 20. In the latter alternative, this ferromagnetic layer will cover the digit line congruent structure so as to come down the sides thereof and be in direct physical contact with lower memory layer portions 20. In this latter sequence, however, the portions of layers 23 and 21 which extend outside of the digit line congruent structure will no longer be there because of the etching in contrast to the results shown in FIGS. 1 and 3. There, just openings were formed in layers 23 and 21 rather than removing all portions outside of what was intended to be a digit line congruent structure.

Using again a well-known photoresist application and plasma etching step, this last ferromagnetic layer is etched to leave upper memory layer portions, 24, at each of intersection structures 11. The upper memory layer portion shown in FIGS. 3 and 4 is designated 24' to distinguish it from portion 24 shown to the left in FIG. 2. Each upper memory layer portion 24, as joined to a lower memory layer portion 20 in a resulting intersection memory layer structure, has a digit line 22 pass between them from one side to an opposite side thereof in this structure at each intersection and each such intersection memory layer structure has the remaining two sides of the upper layer portion 24 in direct physical contact with its corresponding one of lower memory layer portions 20.

A further electrical insulating layer, 25, of silicon nitride, is then RF sputtered over this result to a thickness around 1.0 μm. In the process version for which the results are displayed in FIGS. 2, 3 and 4, openings are then provided, using a well-known photoresist application and plasma etch step, through electrical insulating layer 25, diffusion barrier 23, diffusion barrier 21 and electrical insulating layer 19 at locations over the ends of lower word line structures 18. In the alternative process, the same sort of step is used to provide openings in electrical insulating layers 25 and 19 at locations over the same ends of lower word line structures 18.

With these openings completed in either of these process alternatives, a further layer of aluminum alloyed with 4% copper is RF sputtered over the structure again to a corresponding thickness of 0.5 μm. This alloyed aluminum layer will fill the openings just described in the electrical insulating and diffusion barrier layers to come into contact with lower word line structures 18. In the process version having the results shown in FIGS. 2, 3 and 4, again a well-known photoresist application and plasma etch step is used to etch this last layer so as to form a set of top word line layer portions, 26, each of which parallels the lower word line structure portion 18 with which it is in electrical contact as part of a corresponding one of what will be horizontal structures 12. A further silicon nitride diffusion barrier layer, 27, is then provided by RF sputtering over this resulting structure to a thickness of about 700 Å.

Another ferromagnetic thin film permalloy layer is then deposited over layer 27 to a typical thickness of 1.0 μm. Once again, a well-known photoresist application and plasma etch step is used to remove portions of that layer except for a portion provided over each of intersection structures 11 to form upper keepers, 28. Finally, a last silicon nitride layer, 29, is provided as a passivation layer by RF sputtering to a thickness of approximately 1.0 μm.

Yet again, an alternative set of process steps can be provided after the provision of insulating layer 25 on upper magnetic memory layer portions 24. The layer from upper word lines 26 are provided, the layer for diffusion barrier 27, and the layer for upper keepers 28 can be provided in a deposition apparatus sequentially one after the other without any etching steps therebetween. Thereafter, a well-known photoresist application and plasma etch step can be used to etch the layer for the keepers resulting in upper keepers 28, and diffusion barrier layer 27 therebelow, using a single photoresist mask to result in an upper keeper congruent structure. This is followed by a further photoresist application and plasma etch step which forms upper word lines 26. Again, a photoresist application and plasma etch step has been avoided. As before, the final step in this alternative process sequence is to provide passivation layer 29 over the previously fabricated structure.

Bits of information are stored in the memory cell of FIG. 2 through setting the magnetizations of the magnetic memory layer portions therein. The magnetization vectors for each of these memory layer portions are forced to lie in the plane of the thin films forming these portions to avoid what otherwise would be large demagnetizing fields. In the absence of externally applied magnetic fields, the magnetization vectors in these portions will each parallel the easy axis of its portion pointing in one or the other direction along that axis. The storage of one bit in the memory cell shown in FIG. 2 is accomplished through setting the direction of magnetization along the easy axis in both lower magnetic memory layer portion 20 and upper magnetic memory layer portion 24 of the intersection structure 11 on the left, and lower magnetic memory layer portion 20' and upper magnetic memory layer portion 24' of the intersection structure on the right, shown in FIGS. 3 and 4.

A "0" state stored in this storage cell will be defined as having the magnetization vectors pointing toward one another in lower magnetic memory layer portions 20 and 20', but pointing oppositely one another in upper magnetic memory layer portions 24 and 24'. The opposite pattern of magnetization vectors in these magnetic memory layer portions will define a "1" state in the storage cell.

The situation in such film portions changed in the presence of externally applied magnetic fields and the minimization of magnetic energy in each one subjected to them may then occur with the magnetization vector thereof oriented at an angle with respect to the easy axis. As long as the magnetization of the film portion is in a single domain state, the magnetization vector then can be caused to rotate with respect to the easy axis to angles determined by the externally applied fields, and this can occur without substantially affecting the magnitude of the magnetization.

There will also be critical values for external magnetic fields at which there can be transitions of the magnetization vector position from unstable to stable states. The instability is manifested as a flipping of the magnetization vector from pointing at least to some extent along one direction to the easy axis to pointing to at least some extent in the opposite direction. Thus, the magnetization vector can be made to switch from one direction along the easy axis to the opposite which means the magnetization vector can be in one of two different states which, as indicated above, provides the basis for storing an information bit. This magnetization orientation is, of course, accomplished by passing currents through digit line 22 and passing other currents through word line composite 18, 26 to generate the necessary external magnetic fields.

As an example of storing information, assume there is a desire to store a "0" state in the storage cell of FIG. 2, and that it presently has a "1" state stored therein. In that situation, a word line current through word line complex 18, 26 is first provided With the current passing from upper word line portion 26 into lower word line portion 18. The magnetic field generated by such a current rotates the magnetization vectors in the various magnetic memory layer portions of the storage cell. The magnetization vectors are initially pointing toward one another in upper magnetic memory layer portions 24 and 24' for a "1" state having been previously stored. A sufficient current flow in word line 18, 26 in the direction indicated will lead to rotating each of the magnetization vectors in upper magnetic memory layer portions 24 and 24' toward the rear, or loop, portion of digit line 22 in FIG. 2. Although the magnetization vectors in lower magnetic a memory portions 20 and 20' point toward one another initially for a "1" state, they are also rotated by this word line current to point toward the rear in FIG. 2.

Subsequently, the addition of a current in digit line 22 circulating in a counterclockwise direction in FIG. 2, that is into digit line 22 on the right and out of digit line 22 on the left, provides a further magnetic field leading to the magnetization vectors being further rotated. Those in the lower magnetic memory layer portions 20 and 20' will be rotated toward one another by this added field, and those in the upper magnetic memory layer portions 24 and 24' will be rotated away from one another. As a result, the switching threshold will be passed in all of these layers and the magnetization vectors will come to point along the easy axis in each magnetic memory layer portion in the direction opposite to that it was in prior to the provision of the word line and digit line currents.

That is, the magnetization vectors in lower magnetic memory layer portions 20 and 20' will point toward one another, while the magnetization vectors in the upper magnetic memory layer portions 24 and 24' will point opposite one another, i.e. meet the definition of a "0" state. In the opposite sequence of storing states in this storage cell in which a "1" state is stored in the cell after it has been in a "0" state, the same procedure is followed except that the direction of the digit line current is reversed.

Retrieving information from the storage cell shown in FIG. 2 is accomplished through providing just a word line current, but no digit line current, through the cell in the same direction as was used for storage. A differential voltage sensing amplifier is, as indicated above, connected across the ends of digit line 22 (not shown) opposite the "looped" end shown in FIG. 2 to sense the inductively induced voltage which will result from the word line current flow.

That current through word line 18, 26 for purposes of information retrieval would typically be in the form of a trapezoidal pulse with a rising ramp, a plateau and a falling ramp. On the rising ramp, the magnetization vectors in the upper and lower magnetic memory layer portions will all again rotate toward the rear of the structure in FIG. 2. If a "1" state has been stored, the magnetization vectors in upper magnetic memory layer portions 24 and 24' initially point toward one another prior to the rising current ramp, and so the magnetic flux due to each circulates in the opposite direction about digit line 22 when viewed from the differential amplifier ends thereof. The associated magnetic flux of each in the corresponding one of the circulation directions associated therewith can be viewed as rotating out of the conductor loop formed by digit line 22 with the rising current ramp to thereby each inductively produce a voltage of a polarity opposite that of the other across the ends thereof. The magnetization vectors in the lower magnetic memory layer portions 20 and 20', initially directed oppositely one another, can be viewed as having the flux associated therewith circulate about digit line 22 in the same direction as that due to the upper magnetic memory layer portion associated therewith, but in the opposite direction of the other. During the rotation, this flux associated with the lower magnetic memory layer portions is also rotated out of this same loop to produce a voltage at the ends thereof which is added to that due to the magnetization vector rotations in the corresponding upper magnetic memory layer portions to reinforce the differential voltage output of the ends of digit line 22 connected to the differential amplifier.

This result, as indicated, provides differential voltage pulses of one polarity across the ends of digit line 22. The result occurring when the current in word line 18, 26 decreases in the falling ramp leads to differential voltage pulses across the ends of digit line 22 of the opposite polarity. Thus, a voltage pulse pair at one end of digit line 22 due to a word line current ramp, with each pulse having polarity opposite that of the other, represents the output signal at that end for retrieving the information that a "1" state is stored in the storage cell with the opposite pulse pair occurring at the remaining end. Had a "0" state been stored, a voltage pulse pair would again have resulted at each end, but the pulses therein would each have the opposite polarity from those polarities which occurred in the voltage pulse pair resulting from retrieving the information that a "1" state was stored in the storage cell.

Although the present invention has been described with reference to preferred embodiments, workers skilled in the art will recognize that changes may be made in form and detail without departing from the spirit and scope of the invention.

What is claimed is:

1. A thin-film magnetic memory formed on a substrate in a monolithic integrated circuit, said memory comprising:

an elongated first outward loop first conductor supported by said substrate;

a first plurality of anisotropic magnetic thin-film first memory layer portions each provided at a corresponding selected location along said first outward loop first conductor at a side thereof opposite that of said substrate;

an elongated first orthogonal loop conductor provided so as to cross said first outward loop first conductor at least at two of said first memory layer portions in said first plurality thereof on a side thereof opposite that of said first outward loop first conductor;

a first plurality of anisotropic magnetic thin-film second memory layer portions each provided across said first orthogonal loop conductor from a corresponding one of said first plurality of first memory layer portions but with each extending around and past said first orthogonal loop conductor to be in direct contact with its corresponding one of said first plurality of said first memory layer portions; and an elongated first outward loop second conductor provided substantially parallel to said first outward loop first conductor and across therefrom with said first plurality of first memory layer portions, said first orthogonal loop conductor, and said first plurality of second memory layer portions therebetween, said first outward loop second conductor being electrically connected to said first outward loop first conductor 2. The apparatus of claim 1 wherein a first plurality of magnetic thin-film keeper layer portions is provided, supported by said substrate, located between said substrate and said first outward loop first conductor with said first plurality of first memory layer portions each being across said first outward loop first conductor from a corresponding one of said first plurality of first keeper layer portions 3. The apparatus of claim 1 wherein a plurality of magnetic thin-film keeper layer portions is provided each across said first outward loop second conductor from a corresponding one of said first plurality of second memory layer portions 4. The apparatus of claim 1 wherein separation layers are provided between said first outward loop first conductor and said first plurality of first memory layer portions, and between said first plurality of second memory layer portions and said first outward loop second conductor.

5. The apparatus of claim 1 wherein further separation layers are also provided between said first plurality of first memory layer portions and said first orthogonal loop conductor, and between said first orthogonal loop conductor and said first plurality of second memory layer portions.

6. The apparatus of claim 1 further comprising:
a second plurality of anisotropic magnetic thin-film first memory layer portions each provided at a corresponding selected location along said first outward loop first conductor at a side thereof opposite that of said substrate;
an elongated second orthogonal loop conductor provided so as to cross said first outward loop first conductor at least at two of said first memory layer portions in said second plurality thereof on a side thereof opposite that of said first outward loop first conductor; and
a second plurality of anisotropic magnetic thin-film second memory layer portions each provided across said first orthogonal loop conductor from a corresponding one of said second plurality of first memory layer portions but with each extending around and past said second orthogonal loop conductor to be in direct contact with its corresponding one of said second plurality of said first memory layer portions, said second plurality of first memory layer portions, said second orthogonal loop conductor, and said second plurality of second memory layer portions being located between said first outward loop first conductor and first outward loop second conductor.

7. The apparatus of claim 1 further comprising:
an elongated second outward loop first conductor supported by said substrate;
a second plurality of anisotropic magnetic thin-film first memory layer portions each provided at a corresponding selected location along said second outward loop first conductor at a side thereof opposite that of said substrate, said first orthogonal loop conductor crossing said second outward loop first conductor at least at two of said first memory layer portions in said second plurality thereof on a side thereof opposite that of said second outward loop first conductor;
a second plurality of anisotropic magnetic thin-film second memory layer portions each provided across said first orthogonal loop conductor from a corresponding one of said second plurality of first memory layer portions but with each extending around and past said first orthogonal loop conductor to be in direct contact with its corresponding one of said second plurality of said first memory layer portions; and
an elongated second outward loop second conductor provided substantially parallel to said second outward loop first conductor and across therefrom with said second plurality of first memory layer portions, said orthogonal loop conductor, and said second plurality of second memory layer portions therebetween, said second outward loop second conductor being electrically connected to said second outward loop first conductor.

* * * * *

UNITED STATES PATENT AND TRADEMARK OFFICE
CERTIFICATE OF CORRECTION

PATENT NO. : 5,140,549

DATED : August 18, 1992

INVENTOR(S) : Richard.B. Fryer

It is certified that error appears in the above-identified patent and that said Letters Patent is hereby corrected as shown below:

Column 10, line 31, after "said" insert --first--.

Signed and Sealed this

Twenty-fourth Day of August, 1993

Attest:

BRUCE LEHMAN

Attesting Officer

Commissioner of Patents and Trademarks